United States Patent [19]

Mader et al.

[11] 3,731,219

[45] May 1, 1973

[54] PHASE LOCKED LOOP

[75] Inventors: Heinz Bernhard Mader, ch 8570 Weinfelden, Switzerland; Roger Maurice Hochreutiner, Harlow, England

[73] Assignee: International Standard Electric Corporation, New York, N.Y.

[22] Filed: June 13, 1972

[21] Appl. No.: 262,402

[30] Foreign Application Priority Data

July 29, 1971 Great Britain..................35647/71

[52] U.S. Cl. .........................331/14, 331/18, 331/25

[51] Int. Cl. ..............................................H03b 3/04

[58] Field of Search.............................331/14, 18, 25

[56] References Cited

UNITED STATES PATENTS 3,502,976 3/1970 Chamberlin, Jr. et al.............331/14

*Primary Examiner*—John Kominski
*Attorney*—C. Cornell Remsen et al.

[57] ABSTRACT

A hybrid digital phase locked loop is disclosed to recover an isochronous clock from a "stuffed" multiplexed input signal as found in an asynchronous PCM demultiplexer. A low frequency voltage controlled multivibrator is controlled by the output of a phase comparator. The phase comparator is coupled to the input signal and the output signal of a distributor. The distributor is controlled by the multivibrator to sequentially switch a multiphase output signal of a crystal oscillator to provide the output signal of the distributor. This arrangement overcomes the requirement of a voltage controlled crystal oscillator per channel group in the demultiplexer.

9 Claims, 4 Drawing Figures

PHASE LOCKED LOOP

BACKGROUND OF THE INVENTION

This invention relates to a phase locked loop arrangement suitable for use in an asynchronous PCM (pulse code modulation) demultiplexer.

A PCM demultiplexer removes, under the control of a "data link", the "stuffed bits" which were inserted by the multiplexer to equalize the rates of the different incoming groups to the multiplexer. To recover the original group clock in an isochronous form a phase locked loop (PLL) is required. One such loop arrangement comprises a phase comparator driven by the input signal and the output of a voltage controlled crystal oscillator. The comparator output signal is filtered and integrated to provide the control signal for the oscillator. Such a loop may be termed an "analog PLL".

SUMMARY OF THE INVENTION

An object of the present invention is to provide a hybrid digital PLL capable of being employed in an asynchronous PCM demultiplexer.

Another object of the present invention is to provide a PLL to be employed in an asynchronous PCM demultiplexer eliminating the need of an analog PLL for each channel group in the demultiplexer as previously required.

A feature of the present invention is the provision of a phase locked loop arrangement comprising: an input for input signals having an average frequency; a fixed frequency oscillator having a given frequency predeterminedly related to the average frequency; first means coupled to the oscillator to derive from the oscillator *n* output signals, each of the *n* output signals having the given frequency but separated from each other by a phase displacement equal to $360/n°$, where *n* is an integer greater than one; second means coupled to the first means for cyclically and successively selecting the *n* output signals one at a time; a phase comparator coupled to the input and the second means to compare the input signal and the selected one of the *n* output signals and produce a first control signal proportional to the phase difference between the input signal and the selected one of the n output signals; third means coupled to the phase comparator to integrate the first control signal and produce therefrom a second control signal; and a voltage controlled multivibrator coupled to the third means and the second means, the multivibrator being controlled by the second control signal to control the frequency thereof to produce a third control signal, the third control signal controlling the second means to control the rate at which successive ones of the n output signals are selected.

BRIEF DESCRIPTION OF THE DRAWING

Above-mentioned and other features and objects of this invention will become more apparent by reference to the following description taken in conjunction with the accompanying drawings in which.

DESCRIPTION OF THE PREFERRED EMBODIMENT

Figure 1:
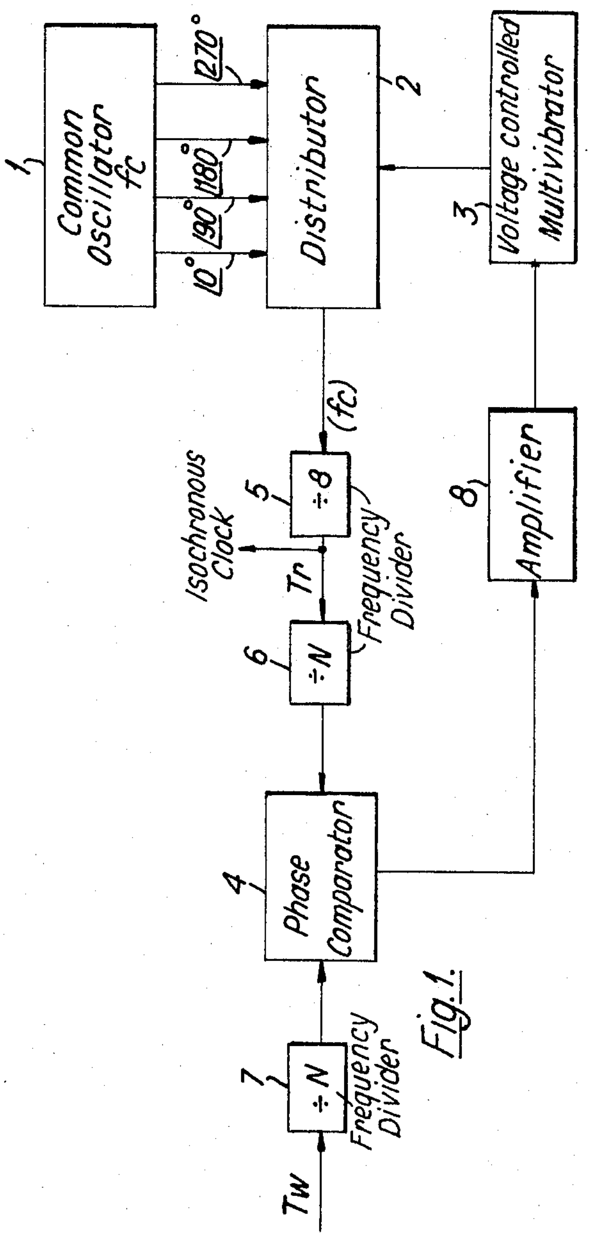
FIG. 1 is a block diagram of a phase locked loop arrangement in accordance with the principles of the present invention.

In the arrangement shown in FIG. 1 an input signal T*w* is assumed as being typically an asynchronous PCM signal the frequency of which is liable to fluctuate. The isochronous clock required in the demultiplexer is designated T*r*.

A fixed frequency ($f_c$) oscillator 1, such as a crystal oscillator is arranged to give four output signals, each of the four output signals having a frequency $f_c$ but with a 90° phase shift between successive outputs. These four output signals are applied to a distributor 2 which is arranged to select the output signals sequentially, one at a time, in response to pulses received from a voltage controlled multivibrator 3. Thus, the distributor output will consist of a burst of frequency $f_c \angle 0°$, $f_c \angle 90°$, $f_c \angle 180°$, $f_c \angle 270°$, $f_c \angle 0°$ and so on, each burst lagging the previous burst with a phase shift of 90°. The distributor output T*r* is applied to a phase comparator 4 together with the input T*w*, and the output of the comparator is used as a control signal for multivibrator 3. In the actual arrangement shown in FIG. 1, oscillator 1 runs at a frequency which is fractionally more than eight times the required clock frequency T*r* and a divide-by-eight circuit 5 is inserted in the distributor output. Also, to minimize the phase jumps which will be effected in T*r* both T*r* and T*w* are passed through identical divide-by-N circuits 6 and 7 before being applied to phase comparator 4. Providied N is made large enough the integrated output of phase comparator 4 becomes in effect a slowly varying d.c. signal. This is passed through amplifier 8 and the amplified signal drives or controls multivibrator 3.

The fixed frequency oscillator 1, is made to run slightly faster, say less than 5 percent, than is normally required, thus introducing what might be termed a "-controlled slip" into the loop. In the case of a T*r* clock frequency of 6 MHz (megahertz) oscillator 1 can be made to run at 49 MHz. This gives an actual clock frequency of $Tr = 49 \div 8 = 6.2$ MHz. The phase steps of T*r* (after the divide-by-eight circuit) are $90° \div 8 = 11°$. Assume that the maximum frequency deviation of T*w* is 500 Hz (hertz), and that the maximum pulse rate of the output signal from multivibrator 3 is to be 16 KHz (kilohertz). When the output of phase comparator 4 reaches a defined threshold a pulse will be delivered to distributor 2 causing an 11° backwards phase jump of the T*r* clock. If the T*w* signal experiences a 360° phase jump through the loss or removal of one bit, comparator 4 will provide a maximum output and the maximum pulse rate of 16 KHz will drive distributor 2. The phase of T*r* will progressively go backwards in 11° steps with a maximum rate of 16,000 steps/second until phase comparator 4 indicates that once again synchronism is reached. This occurs when the output signal of comparator 4 falls below the threshold.

Figure 2:
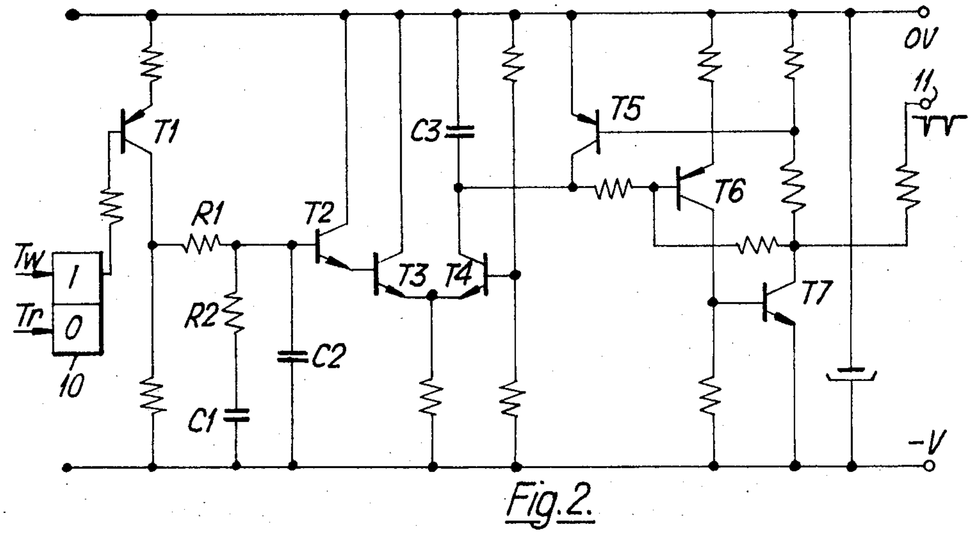
FIG. 2 is a schematic diagram of the phase comparator, amplifier and voltage controlled multivibrator of FIG. 1.

Referring to FIG. 2, phase comparator 4, in a practical circuit, is simply a flip flop device 10 which is set by the T*w* signal and reset by the T*r* signal, or as shown in FIG. 1 by these signals each divided by N. One output of flip flop 10 is taken via transistor T1 and a phase lag filter network R1, R2, C1 to the base of transistor T2. Capacitor C2 is chosen to act as a high frequency noise filter. Transistors T2, T3 and T4 together constitute a voltage controlled current source which continuously takes current out of capacitor C3. A Schmitt trigger circuit is formed by transistors T6 and T7. When "on" the Schmitt trigger circuit discharges C3 through T5. This arrangement ensures that C3 is always fully discharged before the start of the next cycle. The pulses produced at the output of this circuit, at terminal 11 are the control pulses for distributor 2.

Figure 3:
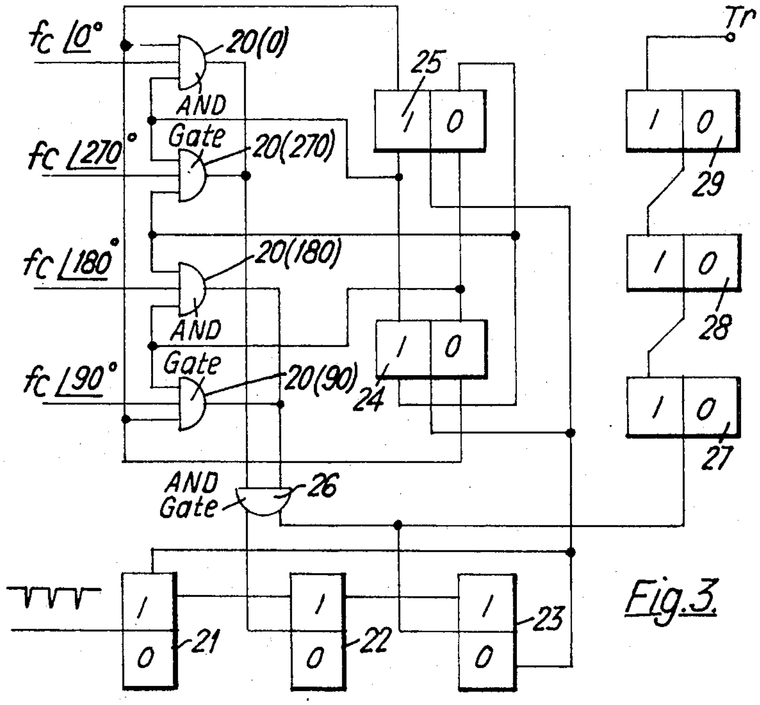
FIG. 3 is a logic circuit diagram of the distributor of FIG. 1.

Referring to FIG. 3, there is illustrated the logic diagram of distributor 2. Distributor 2 receives the four output signals $f_c \angle 0° \ldots f_c \angle 270°$ from the crystal oscillator 1 of FIG. 1. These four signals are applied to four AND gates 20(0), 20(90), 20(180) and 20(270), which are the selection gates. The pulses from the multivibrator are applied to a register flip flop 21, one output of which is applied to two flip flops 22 and 23, which are clocked by the outputs from the gates 20 and act as a retiming circuit. This is done to effect a clean switching operation from the output of one of the gates 20 to the next. The retimed pulses are then fed to a divide-by-four counter constituted by the flip flops 24 and 25. The four outputs from the counter are used to control the gates 20 and effect a sequential selection of the oscillator outputs at a rate determined by the pulses applied to flip flop 21. The outputs of the gates 20 are OR'ed in pairs and applied, via AND gate 26, to a divide-by-eight circuit constituted by flip flops 27, 28 and 29. If the oscillator frequency is 49 MHz the output signal from flip flop 29 is a 6.2 MHz clock, the phase of which will vary from time to time as explained above.

Figure 4:
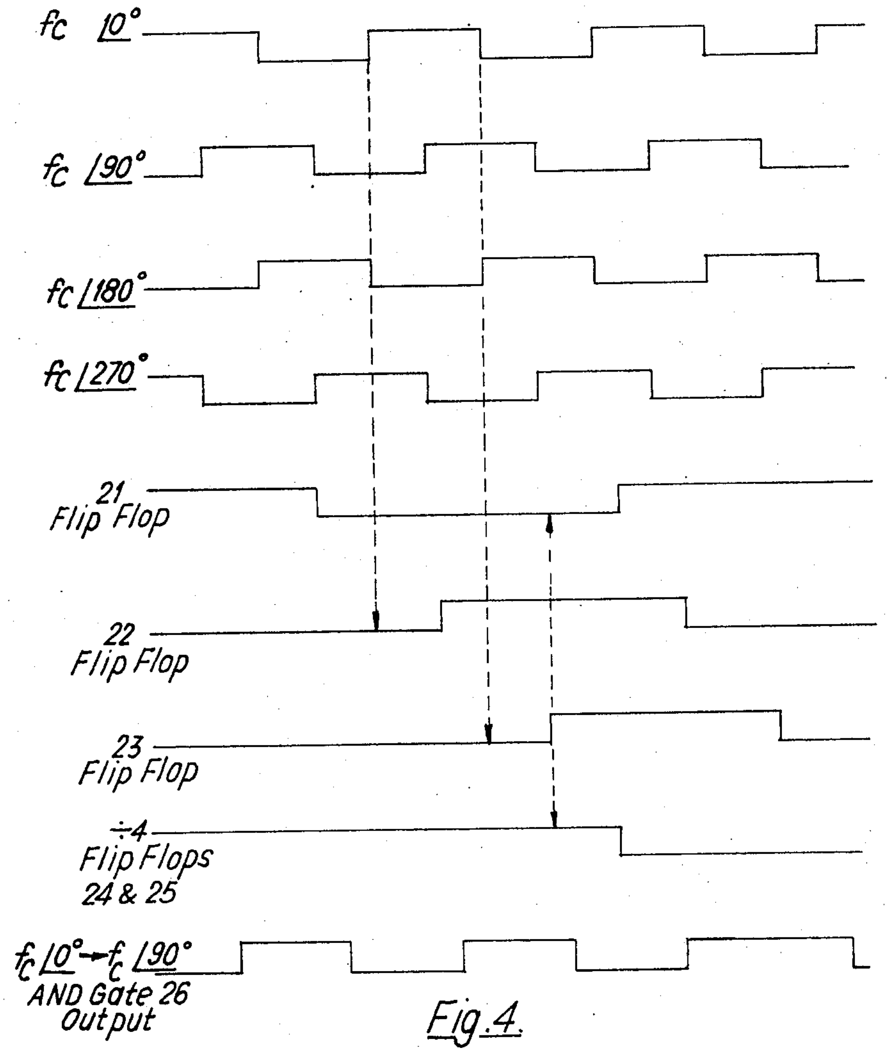
FIG. 4 is a timing diagram showing certain of the waveforms relevant to the operation of the logic circuit diagram of FIG. 3.

FIG. 4 shows the four oscillator output signals $f_c \angle 0°$ etc., each lagging the preceding output by 90°. The output signals of flip flops 21, 22 and 23 are then shown, followed by one of the outputs from the divide-by-four counter. In this example the counter output shown is that which will effect a transfer from gate 20 $\angle 0°$ to gate 20 $\angle 90°$. The result of this transfer is shown in the waveform depicting the output of gate 26 to the divide-by-eight circuit.

While we have described above the principles of our invention in connection with specific apparatus it is to be clearly understood that this description is made only by way of example and not as a limitation to the scope of our invention as set forth in the objects thereof and in the accompanying claims.

We claim:

1. A phase locked loop arrangement comprising:
   an input for input signals having an average frequency;
   a fixed frequency oscillator having a given frequency predeterminedly related to said average frequency;
   first means coupled to said oscillator to derive from said oscillator *n* output signals, each of said *n* output signals having said given frequency but separated from each other by a phase displacement equal to 360/*n*°, where *n* is an integer greater than one;
   second means coupled to said first means for cyclically and successively selecting said *n* output signals one at a time;
   a phase comparator coupled to said input and said second means to compare said input signal and said selected one of said *n* output signals and produce a first control signal proportional to the phase difference between said input signal and said selected one of said *n* output signals;
   third means coupled to said phase comparator to integrate said first control signal and produce therefrom a second control signal; and
   a voltage controlled multivibrator coupled to said third means and said second means, said multivibrator being controlled by said second control signal to control the frequency thereof to produce a third control signal, said third control signal controlling said second means to control the rate at which successive ones of said *n* output signals are selected.

2. An arrangement according to claim 1, wherein said frequency is a given multiple of said average frequency; and further including
   fourth means coupled between said second means and said phase comparator to divide the frequency of said selected one of said *n* output signals by said given multiple to provide said selected one of said *n* output signals with a frequency equal to said average frequency.

3. An arrangement according to claim 1, wherein said given frequency is greater than a given multiple of said average frequency; and further including
   fourth means coupled between said second means and said phase comparator to divide the frequency of said selected one of said *n* output signals by a given amount to provide said selected one of said *n* output signals with a frequency equal to not more than 5 percent in excess of said average frequency.

4. An arrangement according to claim 1, further including
   a first frequency dividing means coupled between said input and said phase comparator, and
   a second frequency dividing means coupled between said second means and said phase comparator,
   the division factor of each of said first and second dividing means being equal.

5. An arrangement according to claim 1, wherein said phase comparator includes
   a flip flop which is set by one of the input signals to said phase comparator and which is reset by the other of the input signals to said phase comparator.

6. An arrangement according to claim 1, wherein said second means includes
   *n* individual gating means, each of said gating means receiving as an input thereto a different one of said *n* output signals, and
   an *n*-stage counting means coupled to said n gating means and said multivibrator, said third control signal controlling said counting means to actuate each of said *n* gating means successively at a different time.

7. An arrangement according to claim 6, wherein said counting means actuates each of said *n* gating means in a given sequence so that each of said selected one of said *n* output signals phase lags the preceding one of each of said selected one of said *n* output signals by 360/*n*°.

8. An arrangement according to claim 6, wherein said second means further includes a retiming means coupled to said multivibrator and said counting means to retime said third control signal to ensure that the switch from one of said *n* gating means to the next of said *n* gating means is effect at a predetermined time in relation to the amplitude of that one of said *n* output signals being selected by the actuated one of said *n* gating means.

9. An arrangement according to claim 1, wherein

*n* is equal to four, and each of said *n* output signals is phase displaced with respect to the successive ones of said *n* output signals by 90°.

* * * * *